US008506754B2

(12) United States Patent
Moshtagh et al.

(10) Patent No.: US 8,506,754 B2
(45) Date of Patent: Aug. 13, 2013

(54) CROSS FLOW CVD REACTOR

(75) Inventors: Vahid S. Moshtagh, Livermore, CA (US); Heng Liu, Livermore, CA (US); Jeffery Ramer, Livermore, CA (US); Michael Solomensky, Livermore, CA (US)

(73) Assignee: Toshiba Techno Center Inc., Tokyo (JP)

( * ) Notice: Subject to any disclaimer, the term of this patent is extended or adjusted under 35 U.S.C. 154(b) by 78 days.

(21) Appl. No.: 12/978,842

(22) Filed: Dec. 27, 2010

(65) Prior Publication Data

US 2011/0089437 A1 Apr. 21, 2011

Related U.S. Application Data (60) Division of application No. 12/259,787, filed on Oct. 28, 2008, which is a continuation-in-part of application No. 11/740,736, filed on Apr. 26, 2007, and a continuation-in-part of application No. 12/165,269, filed on Jun. 30, 2008.

(51) Int. Cl.
  *C23F 1/00* (2006.01)
  *H01L 21/306* (2006.01)

(52) U.S. Cl.
  USPC .................................. 156/345.33; 156/345.34

(58) Field of Classification Search
  USPC .......................................... 156/345.34, 345.33
  See application file for complete search history.

(56) References Cited

U.S. PATENT DOCUMENTS

| 3,757,733 A | | 9/1973 | Reinberg |
| 4,430,149 A | * | 2/1984 | Berkman ........................ 117/97 |
| 4,798,166 A | | 1/1989 | Hirooka et al. |
| 4,812,331 A | | 3/1989 | Hirooka et al. |
| 4,961,399 A | | 10/1990 | Frijilink |
| 4,980,204 A | | 12/1990 | Fujii et al. |
| 4,981,102 A | * | 1/1991 | Gautreaux et al. ............ 118/725 |
| 5,027,746 A | | 7/1991 | Frijlink |
| 5,091,219 A | * | 2/1992 | Monkowski et al. ...... 427/255.5 |

(Continued)

FOREIGN PATENT DOCUMENTS

| JP | 62211914 | 9/1987 |
| JP | 03-263818 | 11/1991 |

(Continued)

OTHER PUBLICATIONS

H. Jurgensen, et al., "MOCVD Equipment for Recent Developments Towards the Blue and Green Solid State Laser", MRS Internet Journal of Nitride Semiconductor Research, vol. 1, Article 26, 1996.

(Continued)

*Primary Examiner* — Keath Chen
(74) *Attorney, Agent, or Firm* — Hogan Lovells US LLP (57) ABSTRACT

A cross flow chemical vapor deposition chamber can comprise an inlet duct having a generally rectangular cross-section and an outlet duct having a generally rectangular cross-section. The rectangular inlet duct and the rectangular outlet duct can facilitate laminar flow of reactant gases over a susceptor. Movable partitions can be configured to define a plurality of zones within the chamber. Each zone can contain a different reactant gas, concentration of reactant gas, and/or flow rate of reactant gas. Enhanced laminar flow can be provided, undesirable depletion of reactant gas can be mitigated, and enhanced control of reactant gases can be facilitated.

14 Claims, 6 Drawing Sheets

(56) References Cited

U.S. PATENT DOCUMENTS

| | | | |
|---|---|---|---|
| 5,281,295 | A | 1/1994 | Maeda et al. |
| 5,334,277 | A | 8/1994 | Nakamura |
| 5,453,124 | A | 9/1995 | Moslehi et al. |
| 5,458,724 | A | 10/1995 | Syverson et al. |
| 5,496,408 | A | 3/1996 | Motoda |
| 5,596,606 | A | 1/1997 | Montreuil |
| 5,653,808 | A | 8/1997 | MacLeish et al. |
| 5,788,777 | A | 8/1998 | Burk |
| 5,976,260 | A | 11/1999 | Kinoshita |
| 5,976,261 | A | 11/1999 | Moslehi |
| 6,080,241 | A | 6/2000 | Li |
| 6,090,211 | A | 7/2000 | Kamei |
| 6,110,556 | A | 8/2000 | Bang et al. |
| 6,113,705 | A | 9/2000 | Ohashi et al. |
| 6,143,077 | A | 11/2000 | Ikeda et al. |
| 6,165,311 | A | 12/2000 | Collins et al. |
| 6,197,121 | B1 | 3/2001 | Gurary et al. |
| 6,302,964 | B1 | 10/2001 | Umotoy et al. |
| 6,348,099 | B1 | 2/2002 | Xia |
| 6,349,668 | B1 * | 2/2002 | Sun et al. ............... 118/723 R |
| 6,465,043 | B1 | 10/2002 | Gupta |
| 6,591,850 | B2 | 7/2003 | Rocha-Alvarez |
| 6,630,053 | B2 | 10/2003 | Yamagishi |
| 6,764,546 | B2 | 7/2004 | Raaijmakers |
| 6,812,157 | B1 | 11/2004 | Gadgil |
| 6,843,882 | B2 | 1/2005 | Janakiraman et al. |
| 6,980,204 | B1 | 12/2005 | Hawkins |
| 2001/0007244 | A1 | 7/2001 | Matsuse |
| 2002/0054745 | A1 | 5/2002 | Van de Walle et al. |
| 2003/0005886 | A1 | 1/2003 | Park et al. |
| 2003/0005958 | A1 | 1/2003 | Rocha-Alvarez et al. |
| 2003/0075273 | A1 * | 4/2003 | Kilpela et al. ........... 156/345.33 |
| 2003/0094903 | A1 | 5/2003 | Tao et al. |
| 2003/0133854 | A1 | 7/2003 | Tabata et al. |
| 2003/0213436 | A1 | 11/2003 | Kwon |
| 2003/0221624 | A1 | 12/2003 | Jurgensen |
| 2004/0089235 | A1 | 5/2004 | Yamada |
| 2004/0099213 | A1 * | 5/2004 | Adomaitis et al. ............ 118/715 |
| 2004/0216668 | A1 | 11/2004 | Lindfors et al. |
| 2005/0003600 | A1 | 1/2005 | Kasai et al. |
| 2005/0011436 | A1 | 1/2005 | Liu |
| 2005/0109280 | A1 * | 5/2005 | Chen et al. .................... 118/724 |
| 2006/0021574 | A1 | 2/2006 | Armour et al. |
| 2008/0057197 | A1 | 3/2008 | Liu |

FOREIGN PATENT DOCUMENTS

| | | |
|---|---|---|
| JP | 1992-209794 | 7/1992 |
| JP | 1995-111244 | 1/1995 |
| JP | 07-111244 | 4/1995 |
| JP | 1998-12554 | 1/1998 |
| JP | 1998-158843 | 6/1998 |
| JP | 2002-110567 | 4/2002 |
| JP | 2003-309075 | 10/2003 |
| WO | WO 92/05577 | 4/1992 |
| WO | WO 99/36587 | 7/1999 |
| WO | WO 0218672 | 3/2002 |
| WO | WO 2005/010227 | 2/2005 |

OTHER PUBLICATIONS

Woelk, "Metalorganic Vapor Phase Epitaxy for Specialty Semiconductor Devices", Source Unknown, Date of publication predates date of application.

U.S. Appl. No. 10/621,049, filed Jul. 15, 2003, Liu, Heng.

U.S. Appl. No. 12/259,787, filed Oct. 28, 2008, Moshtag, et al.

U.S. Appl. No. 12/058,380, filed Mar. 28, 2008, Vahid Moshtagh et al.

J. Dai "Atmospheric pressure MOCVD Growth of high-quality ZnO films on Al O templates", Journal of Crystal Growth 283 (2005), pp. 93-99.

Theodoropoulos et al. "Design of gas inlets for the growth of gallium nitride by metalorganic vapor phase epitaxy", Journal of Crystal Growth217 (200), pp. 65-81.

Thomas Swan, "CVD Reactor", Source Unknown, Date of publication predates date of application filing.

\* cited by examiner

CROSS FLOW CVD REACTOR

RELATED APPLICATIONS

This patent application is a divisional patent application of U.S. Ser. No. 12/259,787, filed on Oct. 28, 2008 and entitled Slab Cross Flow CVD Reactor, which is a continuation-in-part of patent application Ser. No. 12/165,269, filed on Jun. 30, 2008 and entitled Drilled CVD Shower, and which is a continuation-in-part of patent application Ser. No. 11/740,736, filed on Apr. 26, 2007 and entitled SLAB Cross Flow CVD Reactor, the entire contents of all of which are hereby expressly incorporated by reference in its entirety.

TECHNICAL FIELD

The present invention relates generally to chemical vapor deposition (CVD). The present invention relates more particularly to methods and systems for forming light emitting diodes using a cross flow CVD reactor.

BACKGROUND

Reactors for use in chemical vapor deposition (CVD), such as metal oxide chemical vapor deposition (MOCVD), are well known. Such reactors are used to deposit material upon a substrate during the manufacturing of light emitting diodes (LEDs).

Although such CVD reactors have proven generally suitable for their intended purposes, they possess inherent deficiencies which detract from their overall effectiveness and desirability. Examples of these deficiencies include problems related to turbulent flow and depletion of reactant gases, as discussed below.

The proposed solutions to these problems have, to date, been ineffective in providing a satisfactory remedy. Therefore, it is desirable to provide an enhanced CVD reactor.

BRIEF SUMMARY

Methods and systems are disclosed herein to provide laminar flow and enhanced control of reactant gases for a chemical vapor deposition (CVD) reactor, such as a metal oxide chemical vapor deposition (MOCVD) reactor. Laminar flow over a susceptor of a CVD chamber can result in more uniform deposition of materials upon wafers. Enhanced control of reactant gases can mitigate the undesirable effects of reactant gas depletion.

In accordance with an example of an embodiment, a chemical vapor deposition reactor can comprise a chamber having a generally circular cross-section and a susceptor disposed within the chamber. An inlet duct that provides reactant gas to the chamber can have a generally rectangular cross-section. Similarly, an outlet duct that facilitates removal of gases from the chamber can have a generally rectangular cross-section.

In accordance with an example of an embodiment, a chemical vapor deposition reactor can comprise a chamber and a lid that is configured to seal the chamber. At least one movable partition can be disposed within the lid and can be configured to define a plurality of zones within the chamber.

In accordance with an example of an embodiment, a chemical vapor deposition system can comprise a chamber having generally circular cross-section, a susceptor disposed within the chamber, an inlet duct having a generally rectangular cross-section, and an outlet duct having a generally rectangular cross-section. A group V reactant gas supply can be configured to provide group V reactant gas to the inlet duct.

A lid that is configured to seal the chamber can comprise at least one movable partition that can be configured to define a plurality of zones within the chamber. A group III reactant gas supply can be configured to provide group III reactant gas to the zones. The flow of group III reactant gas can be individually controllable for each zone.

In accordance with an example of an embodiment, a method for performing chemical vapor deposition can comprise moving a reactant gas into a chamber from an inlet duct having a generally rectangular cross-section, moving the reactant gas over a susceptor, and moving the reactant gas out of the chamber into an outlet duct having a generally rectangular cross-section. In this manner, laminar flow of the reactant gas can be provided.

In accordance with an example of an embodiment, a method for performing chemical vapor deposition can comprise separating reactant gases from one another via at least one movable partition that is configured to define a plurality of zones within a chemical vapor deposition chamber. The separated reactant gases can be injected into respective zones of the chamber.

In accordance with an example of an embodiment, a method for performing chemical vapor deposition can comprise moving a first reactant gas into a chamber from an inlet duct having a generally rectangular cross-section, moving the first reactant gas over a susceptor, and moving the gas out of the chamber into an outlet duct having a generally rectangular cross-section. A plurality of second reactant gases can be separated from one another via at least one movable partition that is configured to define a plurality of zones within a chemical vapor deposition chamber. The separated gases can be injected into respective zones of the chamber.

In accordance with an example of an embodiment a chemical vapor deposition system can comprise means for moving a reactant gas into a chamber from an inlet duct having a generally rectangular cross-section, means for moving the reactant gas over a susceptor, and means for moving the reactant gas out of the chamber into an outlet duct having a generally rectangular cross-section.

In accordance with an example of an embodiment, a chemical vapor deposition system can comprise means for separating reactant gases from one another so as to define a plurality of zones within a chemical vapor deposition chamber. The chemical vapor deposition system can further comprise means for injecting the separated gases into respective zones of the chamber.

In accordance with an example of an embodiment, an LED can be made by a process comprising moving a reactant gas into a chamber from an inlet duct having a generally rectangular cross-section, moving the reactant gas over a susceptor, and moving the reactant gas out of the chamber into an outlet duct having a generally rectangular cross-section.

In accordance with an example of an embodiment, an LED can be made by a process comprising separating reactant gases from one another via at least one movable partition that is configured to define a plurality of zones within a chemical vapor deposition chamber and injecting the separated gases into respective zones of the chamber.

Enhanced laminar flow can be provided, undesirable depletion of reactant gases can be mitigated, and enhanced control of reactant gases can be facilitated. Process yield can be increased and process costs can be decreased.

This invention will be more fully understood in conjunction with the following detailed description taken together with the following drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Turbulent flow is undesirable in CVD (chemical vapor deposition) reactor systems. Turbulent flow tends to cause reactant gas concentrations and flow rates to vary undesirably across the surface of a susceptor. These variations can cause non-uniform deposition of materials upon the wafers being processed. Such non-uniform deposition of materials can adversely affect the quality of light emitting diodes (LEDs), as well as the yield of the process.

Turbulent flow can also inhibit the efficient use of reactant gases. This can result in less of the reactant gases being used in the deposition process than is desirable. Thus, too much of the reactant gases can be wasted due to turbulent flow within the reactor.

The premature depletion of reactant gases is also undesirable in CVD reactor systems. The premature depletion of reactant gases inhibits the uniform deposition of materials upon the wafers. The premature depletion of reactant gases also inhibits the efficient use of reactant gases. When one reactant gases is depleted, it is not available for reaction with other reactant gases and the other reactant gases can be wasted.

An undesirably wide process parameter space typically has to be investigated in an attempt to find the optimum conditions for performing the contemporary CVD process. Undesirable interactions often occur between process parameters. That is, there is substantial cross-talk between process parameters. This cross-talk makes the effect of changing a parameter undesirably difficult to predictable in contemporary CVD systems. This happens because changing one parameter can undesirably effect a corresponding change in one or more other parameters. The magnitude and direction (increased or decreased flow), as well as where (upon which wafers or upon which portions of wafers) the effect occurs, can be difficult or impossible to predict.

For example, when there is a desire to increase the group V/III ratio, the increase can be accomplished by increasing the $NH_3$ flow rate while fixing the group III flow rate. However, the group III flow toward the wafers will be affected in a manner that frequently necessitates adjustment of the group III flow rate, as well as the group III distribution. Adjustment of the group III flow rate and distribution are necessary so as to maintain the same deposition or growth uniformity. As such, interaction between the two flow rates is undesirable because it complicates the process optimization procedure.

Systems and methods for enhancing the chemical vapor deposition (CVD) process are disclosed herein. More particularly, enhanced laminar flow of reactant gases over the susceptor can be achieved. Also, undesirable depletion of reactant gases can be mitigated. Also, enhanced control of reactant gases can be achieved.

In accordance with an example of an embodiment, a chemical vapor deposition reactor can comprise a chamber having a generally circular cross-section and a susceptor disposed within the chamber. An inlet duct that provides reactant gas to the chamber can have a generally rectangular cross-section. Similarly, an outlet duct that facilitates removal of gases from the chamber can have a generally rectangular cross-section.

The chamber, the inlet duct, and the outlet duct can cooperate to provide generally laminar flow of reactant gases over the susceptor. Such laminar flow can enhance the uniformity of the deposition of materials upon the wafers carried by the susceptor.

The inlet duct and the outlet duct outlet duct can be welded to the chamber. Alternatively, the inlet duct and the outlet duct can be removably attached to the chamber. For example, the inlet duct and the outlet duct can be bolted to the chamber.

An upper surface of a lower wall of the inlet duct and an upper surface of a lower wall of the outlet duct outlet duct can be approximately level with an upper surface of the susceptor. Thus, disruption to the laminar flow of gases across the gap between the lower surface of the inlet duct and the susceptor and disruption to the laminar flow of gases across the gap between the susceptor and the lower surface of the outlet duct can be mitigated. In this manner, enhanced laminar flow can be facilitated.

A gap between an upper surface of the lower wall of the inlet duct the upper surface of the susceptor can be less than 2 millimeters and a gap between an upper surface of the lower wall of the outlet duct outlet duct and an upper surface of the susceptor can be less than approximately 2 millimeters. Thus, disruption to the laminar flow of gases across the gap between the lower surface of the inlet duct and the susceptor and disruption to the laminar flow of gases across the gap between the susceptor and the lower surface of the outlet duct can be mitigated. In this manner, enhanced laminar flow can be facilitated.

In accordance with an example of an embodiment, a chemical vapor deposition reactor can comprise a chamber and a lid that is configured to seal the chamber. At least one movable partition can be configured to define a plurality of zones within the chamber.

The lid can comprise a shower head. For example, the lid can comprise a drilled shower head wherein openings drilled in a lower surface of the shower head define reactant gas injectors. An example of an embodiment of a drilled shower head is described herein. Another example of a drilled shower head is described in U.S. Ser. No. 12/165,269, filed on Jun. 30, 2008 and entitled Drilled CVD Shower Head, the entire contents of which are hereby expressly incorporated by reference in their entirety.

The lid can comprise a drilled shower head and the zones can receive reactant gas from the shower head. Each zone can be configured to receive a different reactant gas, concentration of reactant gas, and/or flow rate of reactant gas. The zones can be configured such that a reactant gas or gases of each zone do not substantially mix with one another until the reactant gas or gases move beyond the partitions, e.g., until the reactant gas or gases enter the chamber and/or are proximate the wafers.

A plurality of slots can be provided in the lid of the chamber, within which the partitions can be positionable. Thus, the partitions or portions of the partitions can be received within the slots so as to define the size and position of the zones.

The slots can be generally evenly spaced with respect to one another. The slots can be unevenly spaced with respect to one another. For example, slots closer to the laminar flow reaction gas inlet can be spaced closer to one another than slots farther from the inlet. The slots can be configured such that the partitions can be arranged in any desired configuration.

For example, the chemical vapor deposition reactor can comprising two rails disposed with the lid thereof. The rails can be generally parallel with respect to one another and can have a plurality of slots formed therein such that ends of the partitions can be disposed within the slots with the partitions disposed between the rails.

The partitions can be generally rectangular partitions. The partition(s) can be generally planar partitions. Thus, the partitions can be defined by generally flat structures. The partitions can be formed of metal. Those skilled in the art will appreciate that other materials are suitable.

The partitions can be non-planar partitions. For example, partition(s) can be curved partitions. The partitions can be shaped substantially like a semicircle, a circle, an oval, a square, or a triangle. The partitions can have any desired shape. Any desired combination of shapes of partitions can be used.

In accordance with an example of an embodiment, a chemical vapor deposition system can comprise a chamber having a generally circular cross-section, a susceptor disposed within the chamber, an inlet duct having a generally rectangular cross-section, and an outlet duct having a generally rectangular cross-section. A group V reactant gas supply can be configured to provide group V reactant gas to the inlet duct.

A lid can be configured to seal the chamber. At least one movable partition can be configured to define a plurality of zones within the chamber. A group III reactant gas supply can be configured to provide group III reactant gas to the zones. The flow of group 111 reactant gas can be individually controllable for each zone.

In accordance with an example of an embodiment, a method for performing chemical vapor deposition can comprise moving a reactant gas into a chamber from an inlet duct having a generally rectangular cross-section, moving the reactant gas over a susceptor, and moving the reactant gas out of the chamber into an outlet duct having a generally rectangular cross-section. In this manner, laminar flow of the reactant gas can be provided.

In accordance with an example of an embodiment, a method for performing chemical vapor deposition can comprise separating reactant gases from one another via at least one movable partition that is configured to define a plurality of zones within a chemical vapor deposition chamber. The separated reactant gases can be injected into respective zones of the chamber.

In accordance with an example of an embodiment, a method for performing chemical vapor deposition can comprise moving a first reactant gas into a chamber from an inlet duct having a generally rectangular cross-section, moving the first reactant gas over a susceptor, and moving the gas out of the chamber into an outlet duct having a generally rectangular cross-section. A plurality of second reactant gases can be separated from one another via at least one movable partition that is configured to define a plurality of zones within a chemical vapor deposition chamber. The separated gases can be injected into respective zones of the chamber.

In accordance with an example of an embodiment a chemical vapor deposition system can comprise means for moving a reactant gas into a chamber from an inlet duct having a generally rectangular cross-section, means for moving the reactant gas over a susceptor, and means for moving the reactant gas out of the chamber into an outlet duct having a generally rectangular cross-section.

In accordance with an example of an embodiment, a chemical vapor deposition system can comprise means for separating reactant gases from one another so as to define a plurality of zones within a chemical vapor deposition chamber and means for injecting the separated gases into respective zones of the chamber.

In accordance with an example of an embodiment, an LED can be made by a process comprising moving a reactant gas into a chamber from an inlet duct having a generally rectangular cross-section, moving the reactant gas over a susceptor, and moving the reactant gas out of the chamber into an outlet duct having a generally rectangular cross-section.

In accordance with an example of an embodiment, an LED can made by a process comprising separating reactant gases from one another via at least one movable partition that is configured to define a plurality of zones within a chemical vapor deposition chamber and injecting the separated gases into respective zones of the chamber.

Figure 1:
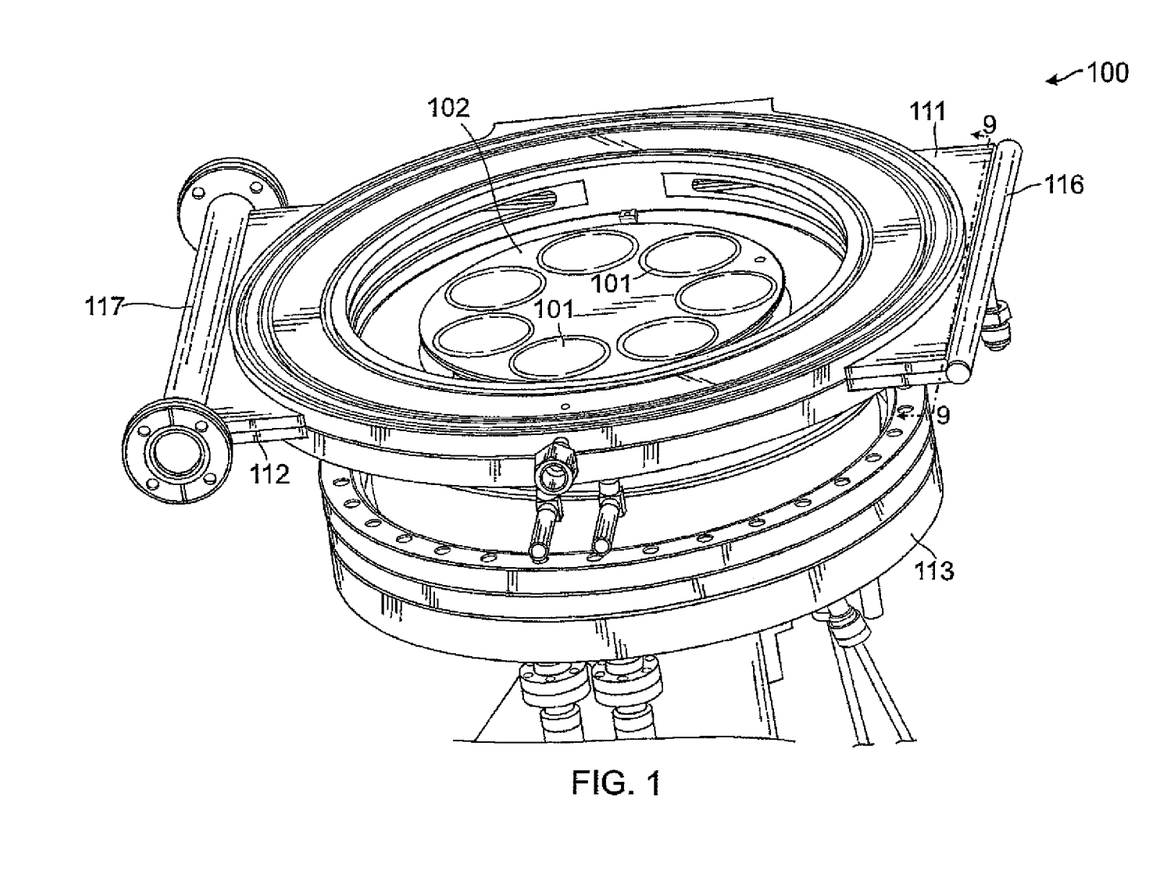
FIG. 1 is a semi-schematic perspective view of a chemical vapor deposition reactor having the lid removed therefrom and having a generally rectangular reactant gas inlet and a generally rectangular reactant gas outlet according to an example of an embodiment.

Referring now to FIG. 1, a metal oxide chemical vapor deposition (MOCVD) reactor 100, having the lid thereof removed, is shown. Such a reactor 100 can be used to deposite gallium nitride (GaN) on sapphire wafers to form light emitting diodes (LEDs), for example. Wafers can be placed in recesses 101 on a susceptor 102, which is heated to 1200° C. range. Susceptor 102 can be rotated by a spindle or shaft 103 (FIGS. 3-5) mounted to center of susceptor 102. Ammonia ($NH_3$), nitrogen ($N_2$), and/or hydrogen ($H_2$), as well as a gaseous form of gallium (Ga), can be fed into the reactor to facilitate the deposition of gallium nitride (GaN) upon the sapphire wafers.

The chamber 100 can comprise a double walled, water cooled chamber 100. The substantially laminar cross flow of gases can be facilitated by the use of an inlet duct 111 and an outlet duct 112. Inlet duct 111 and outlet duct 112 tend to cause gases to move generally horizontally, from left to right in FIG. 1. The gases tend to flow generally laminarily over the susceptor 102, and thus over any wafers carried thereby. A base plate 113 can seal the bottom of the chamber 100.

The inlet duct 111 and the outlet duct 112 can be generally rectangular. That is, the inlet duct 111 and the outlet duct 112 can have generally rectangular inside cross-sectional areas. The inlet duct 111 and the outlet duct 112 can have approximately the same inside cross-sectional areas.

The inside dimensions of the inlet duct 111 and the outlet duct 112 can be approximately equal to one another. For example, the inside length (dimension D of FIG. 9) of a cross-section of the inlet duct 111 can be approximately equal to the inside length (again dimension D of FIG. 9) of a cross-section of the outlet duct 112. Similarly, the inside height (dimension C of FIG. 9) of a cross-section of the inlet duct 111 can be approximately equal to the inside height (again dimension C of FIG. 9) of a cross-section of the outlet duct 112.

The inlet duct 111 can be supplied with reactant gas, such as ammonia ($NH_3$), by an inlet gas manifold 116. An exhaust or outlet gas manifold 117 can facilitate removal of gas for the chamber 100 via gas outlet duct 112. The outlet duct 112 can be connected to a vacuum system.

The inlet gas manifold 116 can provide reactant gas to a plurality of chambers, such as chamber 100. Similarly, the outlet gas manifold can facilitate the removal of gas from a plurality of chambers, such as chamber 100.

Figure 2:
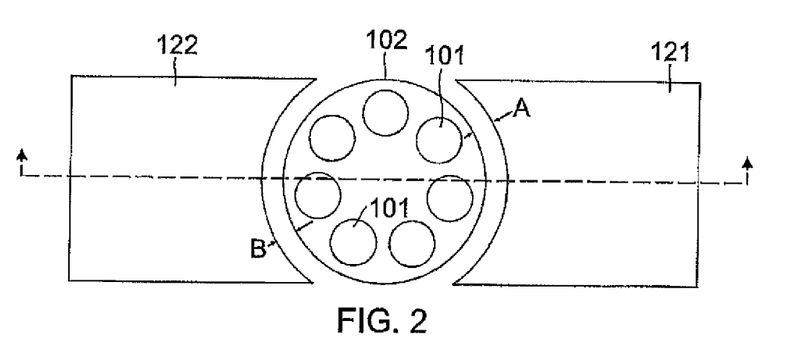
FIG. 2 is a semi-schematic top view of a susceptor and the upper surfaces of the lower walls, i.e., the floors, of the generally rectangular reactant gas inlet and the generally rectangular reactant gas outlet, showing the gap between the susceptor and the lower walls according to an example of an embodiment.

Referring now to FIG. 2, the upper surface 121 of the bottom wall of the inlet duct 111 forms a gap, Dimension A, with respect to the susceptor 102. Similarly, the upper surface 122 of the bottom wall of the outlet duct 111 forms a gap, Dimension B, with respect to the susceptor 102. Dimension A and Dimension B can both be less than 2 millimeters. Reducing the size of Dimension A and Dimension B generally tends to enhance the laminar flow of reactant gases over the susceptor 102.

Figure 3:
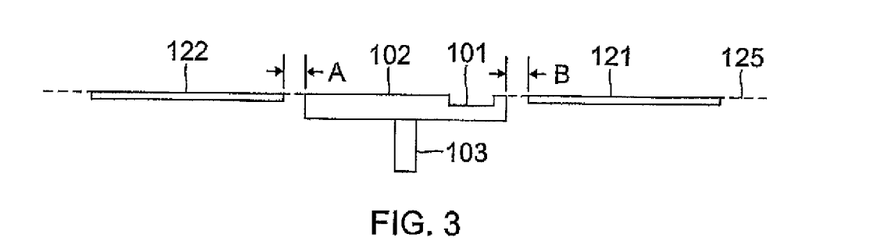
FIG. 3 is a semi-schematic side view of a susceptor and the upper surfaces of the lower walls, i.e., the floors, of the generally rectangular reactant gas inlet and the generally rectangular reactant gas outlet, showing the gap between the susceptor and the lower walls and also showing the generally flush upper surfaces of the susceptor and the upper surfaces of the walls, according to an example of an embodiment.

Referring now to FIG. 3, the upper surface 121 of the bottom wall of the inlet duct 111 can be approximately level or flush with the upper surface of the susceptor 102. Similarly, the upper surface 122 of the bottom wall of the outlet duct 112 can be approximately level or flush with the upper surface of the susceptor 102. The upper surface of the bottom wall of the inlet duct 111, the upper surface of the susceptor 102, and the upper surface of the bottom wall of the outlet duct 112 can all be generally co-planar with one another and can all be approximately upon the plane designated by dashed line 125.

Figure 4:
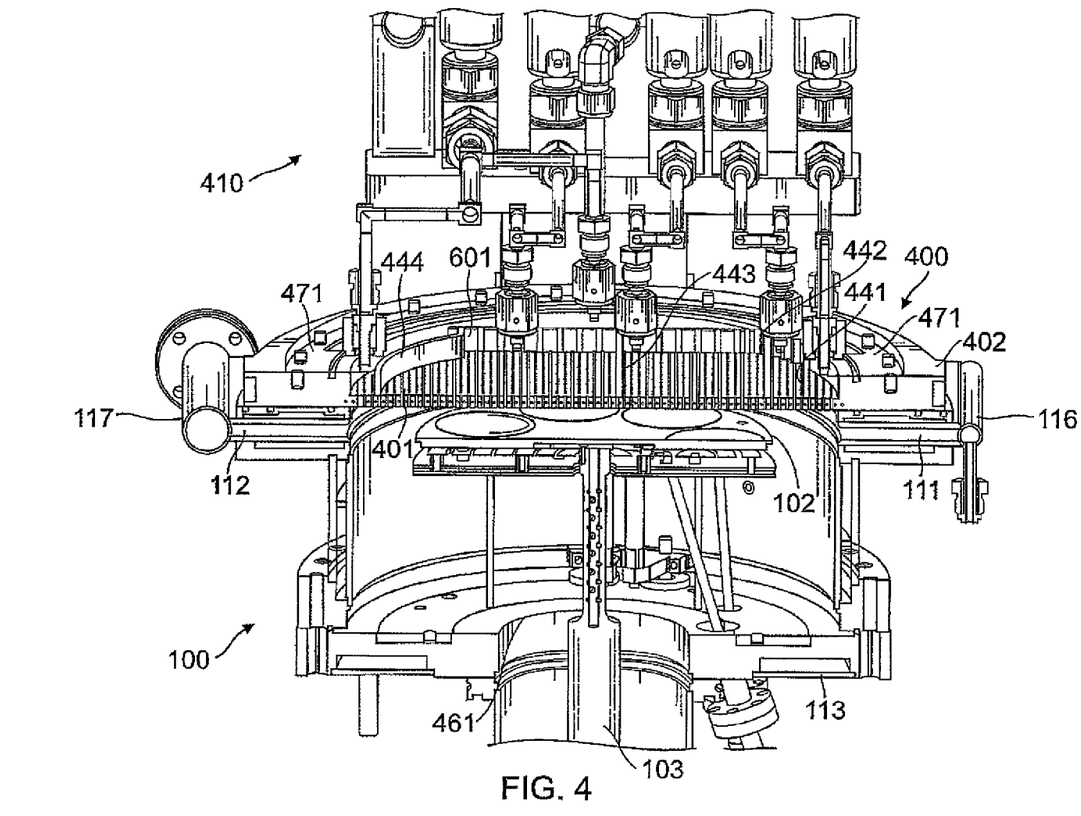
FIG. 4 is a semi-schematic cross-sectional side view of a chemical vapor deposition reactor having a generally rectangular inlet and a generally rectangular outlet, as well as having a plurality of movable partitions, according to an example of an embodiment.
Figure 5:
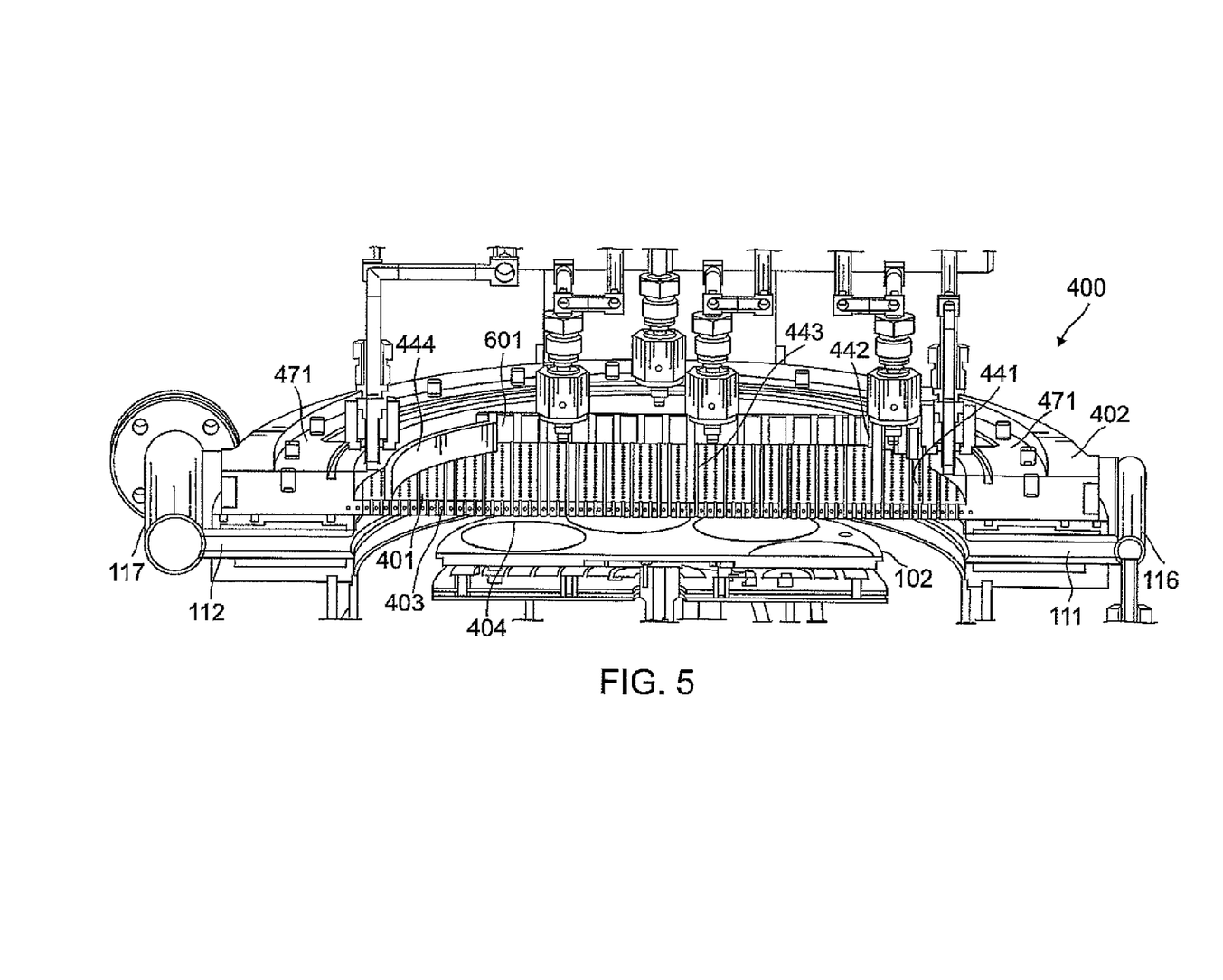
FIG. 5 is an enlarged semi-schematic side view of a portion of the chemical vapor deposition reactor of FIG. 4.

Referring now to FIGS. 4 and 5, the top of the chamber or lid 400 closes and seals the chamber 100 during processing. The lid 400 can comprise a shower head, such as drilled shower head 401. Drilled shower head 401 can, for example, comprise a plate 402 having a plurality (thousands, for example) of generally vertical holes 403 drilled therein. Reactant gase supply 410 can provide gas to the upper surface of the plate 402. The reactant gases can pass through the holes 403, which can function as injectors, and into chamber 100. Thus, the lid can comprise a shower head defined by holes 403 in plate 402.

Horizontal holes 404 can be provided in plate 402 to facilitate water cooling of the shower head 401. Water can circulate through horizontal holes 404 to provide cooling. Thus, cool water from an external source can be pumped through the lid 400, such as through the shower head thereof, to provide desired cooling.

Reactant gases from reactant gas supply 410 can enter the lid 400 above the plate 402. Partitions 441-444 can define zones into which reactant gases flow. Each zone can receive different reactant gases, different concentrations of reactant gases, and/or different flow rates of reactant gases from reactant gas supply 410. The zones can tend to keep the received gases separate from one another as the gases enter the lid 400 and pass through the shower head 401. The zones can extend, at least to some degree, toward the upper surfaces of the wafers.

The spindle 103 can extend through base center hole 461 of base plate 113. A ferro fluidic mechanical seal can be used to maintain integrity of the reactor such that a vacuum can be provided within chamber 100.

In operation, the cross flow CVD reactor can deposit gallium nitride (GaN) upon sapphire wafers by flowing ammonia ($NH_3$) from the inlet duct 111 across the susceptor and out of the chamber through the outlet duct 112. At the same time, the injectors or holes 403 of shower head 401 inject nitrogen ($N_2$), hydrogen ($H_2$), and a gaseous form of gallium (Ga) into the chamber 100 and thus onto the wafers. The shower head 401 can be close enough to the spinning hot susceptor 102 to facilitate the deposition of GaN onto the wafers. Gasses exhaust through gas outlet duct 112.

The partitions 441-444 allow operator control flow rate of reactant gases through the shower head and into zones within the chamber 100. This enables the operator to better control the uniformity of material deposition upon wafers.

A cover plate 471 can provide access to the partitions 441-444. The cover plate 471 can be removably attached to the lid 400. For example, the cover plate 471 can be bolted to the lid 400. Thus, the cover plate can be removed from the lid 471 so that the partitions 441-444 can be moved and the zones 801-805 (FIG. 8) re-defined. The zones can be re-define to fine-tune or otherwise change the flow of reactant gases within the chamber 100.

Figure 6:
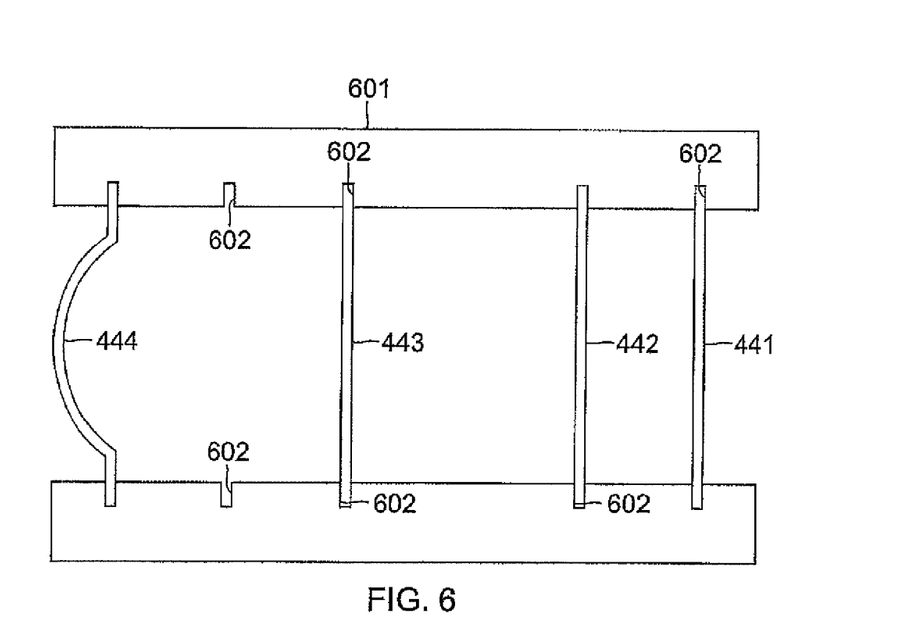
FIG. 6 is a semi-schematic top view of movable partitions and the rails for removably attaching the partitions, wherein slots in the rails are approximately evenly spaced with respect to one another, according to an example of an embodiment.
Figure 7:
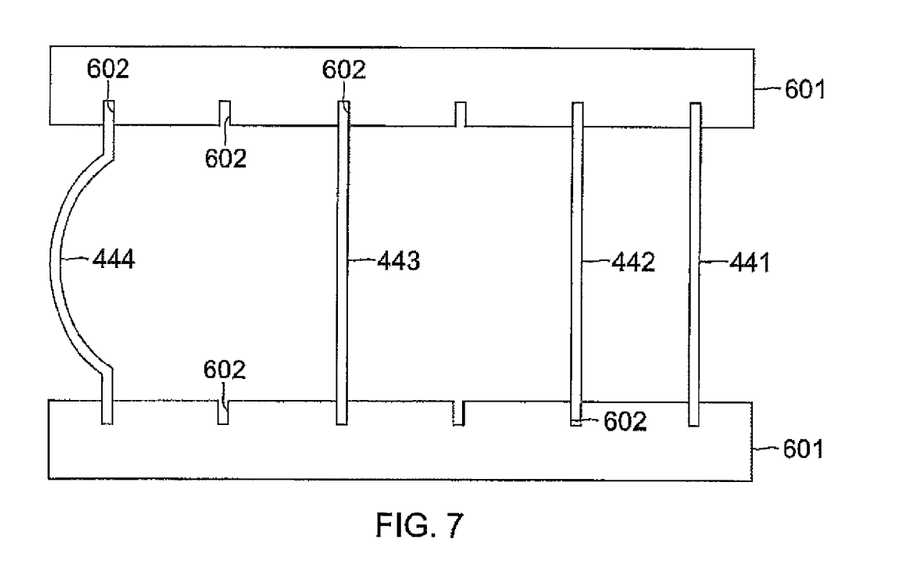
FIG. 7 is a semi-schematic top view of movable partitions and the rails for removably attaching the partitions, wherein slots in the rails are unevenly spaced with respect to one another, according to an example of an embodiment.

Referring now to FIGS. 6 and 7, the lid 400 can comprise a pair of generally parallel rails 601 for mounting the partitions 441-444. The partitions 441-444 can mount into slots 602 formed in the rails 601. The rails 601 can be integrally formed with the plate 402, such as by machining the slots 402 into the plate 402. Alternatively, the rails can be attached, such as via bolting, to the plate 402 or to another structure of the lid 400.

The partitions 441-444 can be generally rectangular in shape. Alternatively, the partitions 441-444 can be of any other desired shape. The partitions 441-444 can be generally flat, e.g., planar, partitions. Alternatively, the partitions can be non-planar. For example, partition 444 can be bowed or curved so as to better conform to the circular shape of the chamber (as best appreciated in FIGS. 4 and 5).

With particular reference to FIG. 6, the slots 602 can be evenly spaced along the length of the rails 601. The partitions 441-442 can mount to the rails 601 by placing the ends of the partitions into the slots 602.

With particular reference to FIG. 7, the slots 602 can be unevenly spaced along the length of the rails 602. For example, the slots 602 can generally be closer together proximate the inlet duct 111 and can be further apart closer to the outlet duct 112. By making the slots 602 closer together proximately the inlet duct 111, better control, e.g., better resolution of partition position, can be provided proximate the inlet duct 111, where the concentration of non-reacted gas, e.g., ammonia, provided by the inlet duct 111 tends to the greatest. Any desired spacing of the slots 602 can be used.

Figure 8:
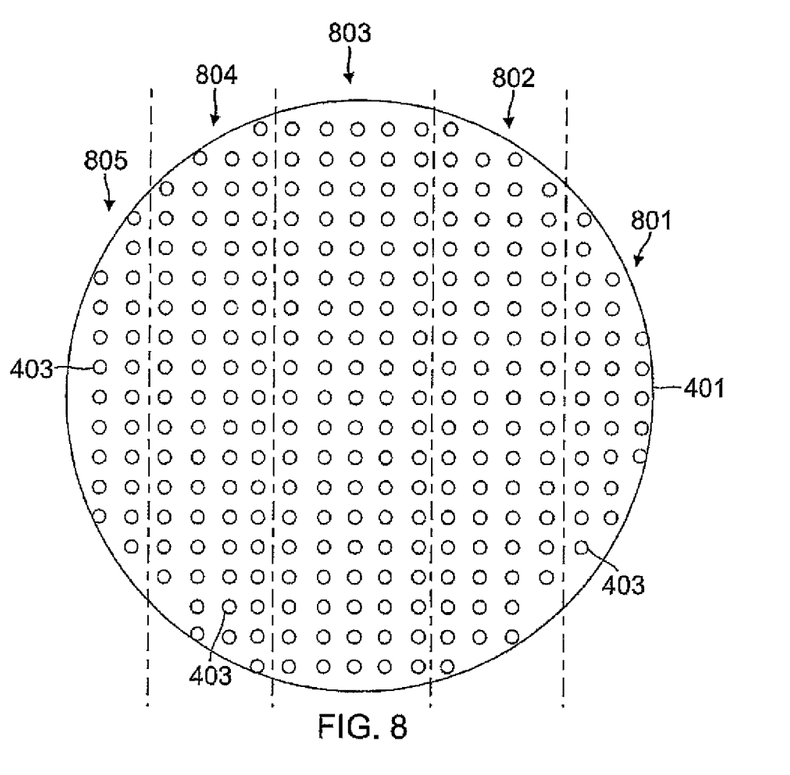
FIG. 8 is a semi-schematic bottom view of a shower head showing zones formed by the use of movable partitions, according to an example of an embodiment.

Referring now to FIG. 8, the bottom of the shower head 401 is shown. A plurality of zones 801-805 are defined at the bottom of the shower head 401 (inside of the chamber 100) by the partitions mounted to the top of the shower head 401. The zones 801-805 within the chamber tend to correspond in size and position to the corresponding zones defined by the partitions 441-444.

Gases within each zone tend to remain, at least to some degree, within that zone during processing. In this manner, the gases, concentrations of gases, and flow rates of gases to different areas, e.g., the zones, within the chamber 100 can be better controlled. Thus, gas flow and distribution above the susceptor 102, as well as above the wafers, can be better controlled.

Such enhanced control can mitigate depletion of reactant gases by providing fresh reactant gases closer to the outlet duct 112. Further enhanced control of the reactant gases can also facilitate the more uniform deposition of materials upon the wafers.

Such enhanced control can be used to mitigate undesirable depletion of $NH_3$ as this gas moves away from inlet duct 111. Thus, the zones can better facilitate the perpendicular (with respect to the zones) flow of $NH_3$ through the chamber.

The partitions 441-444 can base o-ring like seals on top and/or bottom thereof to better inhibity the mixing of gases between zones. The top of each partition 441-444 can have no gap or can have small gap. For example, there can be a gap of approximately 0.005" between the top of a partition 441-444 and the plate 471.

Each zone 441-444 can have either one gas input, e.g. tube, or can have a plurality of gas inputs. The use of a plurality of gas input per zone can result in more uniform gas pressure within the zone. For example, two, three, four, or more inputs can be provided for each zone.

Figure 9:
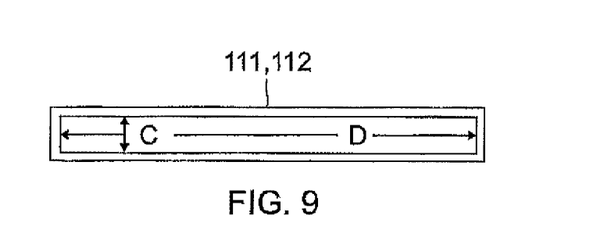
FIG. 9 is a semi-schematic cross-sectional view, such as that taken along line 9 of FIG. 1, showing the internal dimensions of an inlet and/or outlet duct, according to an example of an embodiment.

Referring now to FIG. 9, a ratio of the length, dimension D, to the height, dimension C, of an inlet duct 111 and/or an outlet duct 112 can be between 5 to 1 and 20 to 1. For example, this ration can be approximately 10 to 1, 12 to 1, or 14 to 1.

The gas injectors at the top of the chamber can be divided into a plurality of individually controllable zones. Thus, gas flow can be controlled on a zone basis. That is, gas flow though each of the injectors in a particular zone can be collectively controlled. For example, according to such collective control, a single adjustment can affect gas flow through all of the injectors within a zone, while not substantially affecting gas flow through injectors in other zones.

Alternatively, the gas injectors at the top of the chamber can be controlled on an individual basis. That is, gas flow through each of the injectors can be individually controlled.

Any desired combination of collective and individual control of the gas injectors can be provided. For example, some of the gas flow through the injectors at the top of the chamber can be controlled on a zone basis and some of the gas flow through the injectors at the top of the chamber can be controlled on an individual basis. As a further example, one or more of the injectors within a zone can be individually controllable. Indeed, one, more than one, or all of the injectors can be subject to both zone and individual control.

As a further example, all of the injectors at the top of the chamber can be considered to be in one zone and can thus be collectively controlled. Thus, the effect of the partitions can be negated, if desired.

Any desired number of zones can be provided. Thus, zero, one, two, three, four, five, or more zones can be provided for the injectors at the top of the chamber and/or for the injectors at the end of the chamber.

Each zone can have any desired number of injectors. For example, each zone can have between two and five hundred injectors. As a further example, each zone can have approximately two thousand injectors. The number of injectors can vary from zone to zone.

Each zone can be of any desired configuration. Each zone does not have to have the same configuration as other zones. For example, the zones can be in the form of longitudinal (in the direction of the cross flow) rows, in the form of transverse (perpendicular to the direction of the cross flow) rows, in a checkerboard pattern, or in the form of concentric circles.

The zones can be reconfigurable. For example, by providing individual control of flow through the nozzles, the zones can be software or otherwise configurable so as to have any desired shape or combination of shapes.

According to one or more examples of embodiments, enhanced laminar flow of reactant gases over the susceptor can be achieved, undesirable depletion of reactant gases can be mitigated, and enhanced control of reactant gases can be achieved. Enhance laminar flow and mitigating of depletion tends to provide more uniform deposition of materials upon wafers during the chemical vapor deposition process. Enhanced control of reactant gases tends to simplify process control and shorten the process cycle. Enhance laminar flow, mitigation of depletion, and enhance control of reactant gases all tent to reduce waste.

Embodiments described above illustrate, but do not limit, the invention. It should also be understood that numerous modifications and variations are possible in accordance with the principles of the present invention. Accordingly, the scope of the invention is defined only by the following claims.

The invention claimed is:
1. A chemical vapor deposition reactor comprising:
a chamber;
a susceptor disposed within the chamber;
an inlet duct configured to provide gas to the chamber;
an outlet duct configured to exhaust gas from the chamber;
a lid configured to seal the chamber;
at least one movable partition configured to define a longitudinal row of individually controllable deposition zones within the chamber, wherein the deposition zones are configured to have different sizes in response to locations of the partitions; whereas at least one of the partitions is curved; and
wherein the inlet duct, the outlet duct, and the partition(s) are configured to facilitate laminar flow of gasses in one direction along the longitudinal row of zones and over the susceptor during vapor deposition.

2. The chemical vapor deposition reactor as recited in claim 1, wherein the lid comprises a drilled shower head.

3. The chemical vapor deposition reactor as recited in claim 1, wherein the lid comprises a drilled shower head and the zones receive reactant gas from the shower head, each zone being configured to receive a different reactant gas, concentration of reactant gas, and/or flow rate of reactant gas and wherein the reactant gas(es) of each zone do not substantially mix with one another.

4. The chemical vapor deposition reactor as recited in claim 1, further comprising a plurality of slots within which the partition(s) is/are positionable.

5. The chemical vapor deposition reactor as recited in claim 1, further comprising a plurality of slots within which the partition(s) is/are positionable, the slots being generally evenly spaced with respect to one another.

6. The chemical vapor deposition reactor as recited in claim 1, further comprising a plurality of slots within which the partition(s) is/are positionable, the slots being unevenly spaced with respect to one another.

7. The chemical vapor deposition reactor as recited in claim 1, further comprising a plurality of slots within which the partition(s) is/are positionable, wherein slots closer to the inlet duct are spaced closer to one another than slots farther from the inlet duct.

8. The chemical vapor deposition reactor as recited in claim 1, further comprising two rails, the rails being generally parallel with respect to one another and having a plurality of slots formed therein such that ends of the partitions can be disposed within the slots and the partitions can be disposed between the rails.

9. The chemical vapor deposition reactor as recited in claim 1, wherein partition(s) are generally rectangular partitions.

10. The chemical vapor deposition reactor as recited in claim 1, wherein partition(s) are generally planar partitions.

11. The chemical vapor deposition reactor as recited in claim 1, wherein partition(s) are non-planar partitions.

12. The chemical vapor deposition reactor as recited in claim 1, wherein at least one of the partition(s) is a curved partition.

13. The chemical vapor deposition reactor as recited in claim 1, wherein the inlet duct, the outlet duct, and the partition(s) are configured to facilitate laminar flow of gasses generally horizontally over the susceptor during vapor deposition.

14. The chemical vapor deposition reactor as recited in claim 1, wherein at least one of the partition(s) is configured to have a curved shape able to configure a deposition zone with a curved boundary.

\* \* \* \* \*